US007221076B2

(12) United States Patent  
Baugh

(10) Patent No.: US 7,221,076 B2
(45) Date of Patent: May 22, 2007

(54) MULTIPLE MOVEMENTS HARMONIC FREQUENCY ACTUATOR SYSTEM

(75) Inventor: Brenton A. Baugh, Palo Alto, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/182,175

(22) Filed: Jul. 15, 2005

(65) Prior Publication Data

US 2007/0013265 A1    Jan. 18, 2007

(51) Int. Cl.
    *H01L 41/09* (2006.01)
    *H02N 2/04* (2006.01)
(52) U.S. Cl. ............... 310/328; 310/320; 310/321; 310/323.16; 310/323.17
(58) Field of Classification Search ............... 310/328, 310/311, 321, 323.07, 320, 323.01, 323.16, 310/323.17, 332, 370
    See application file for complete search history.

(56) References Cited

U.S. PATENT DOCUMENTS

| 4,824,205 | A | 4/1989 | Yamashita et al. |
| 5,205,395 | A | 4/1993 | Bruno et al. |
| 6,067,421 | A | 5/2000 | Kitazawa et al. |
| 6,239,534 | B1 * | 5/2001 | Takeuchi et al. ............ 310/328 |
| 6,467,761 | B1 * | 10/2002 | Amatucci et al. ............. 269/58 |
| 6,628,044 | B2 | 9/2003 | Audren et al. |
| 6,841,899 | B2 | 1/2005 | Kaneko |
| 2003/0201695 | A1 * | 10/2003 | Funakubo et al. ..... 310/323.01 |
| 2005/0067922 | A1 * | 3/2005 | Sasaki et al. .......... 310/323.09 |

* cited by examiner

*Primary Examiner*—David Gray
*Assistant Examiner*—Derek Rosenau

(57) ABSTRACT

A system having a harmonic frequency actuator system is provided including providing an actuator body, the actuator body having more than one set of fingers for generating a motion for a semi-rigid element, and attaching a high frequency actuator to the actuator body forming a harmonic frequency actuator to provide motion at predetermined frequency pairs.

2 Claims, 5 Drawing Sheets

MULTIPLE MOVEMENTS HARMONIC FREQUENCY ACTUATOR SYSTEM

BACKGROUND ART

The present invention relates generally to harmonic frequency actuators, and more particularly to a system for a harmonic frequency actuator with dual movements.

Small form factor electronics devices, such as cameras, are becoming common in personal electronics including cell phones and other hand held devices. For small form factor cameras, a motor, such as a DC motor, a stepping motor, an ultrasonic motor, etc., is generally used as a driving source for the focus or focal length adjusting, often referred to as auto focus and zoom, respectively.

Some problems arise by using a motor as a driving source. One problem is that the space required for the motor and a gear reduction block that is necessary for the motor, prevent providing a compact camera. Another problem is that the motor typically has a rising-time characteristic and a multiple-pulse, and as a result a relatively long time interval is needed to move a lens, a film, or an imaging device, to a predetermined distance. Yet another problem is that a dedicated driver circuit for driving the motor is necessary, and thereby costs are increased.

Electronic actuators have been used to address space efficiency, time intervals, and dedicated driver circuit problems. Although well suited for a camera application, actuators fail to address the need of moving two elements to accommodate both zoom and auto focus where two separate lens assemblies need to be moved independently. The industry currently attempts to solve this problem by utilizing two independent actuators. The inherent weakness of two actuators is that twice as much space is consumed in the system. Particularly in the case of cameras intended for use in cell phones, space must be managed carefully.

Numerous technologies have been developed to meet these requirements. Size and power have plagued many of these technologies such as motors and multiple actuators. These technologies have struggled with problems including area, volume and power consumption.

Thus a need still remains for an improved actuator system. In view of the need for more features in less area, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a system having a harmonic frequency actuator system including providing an actuator body, the actuator body having more than one set of fingers for generating a motion for a semi-rigid element and attaching a high frequency actuator forming a harmonic frequency actuator to provide motion at predetermined frequency pairs.

Certain embodiments of the invention have other advantages in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1A:
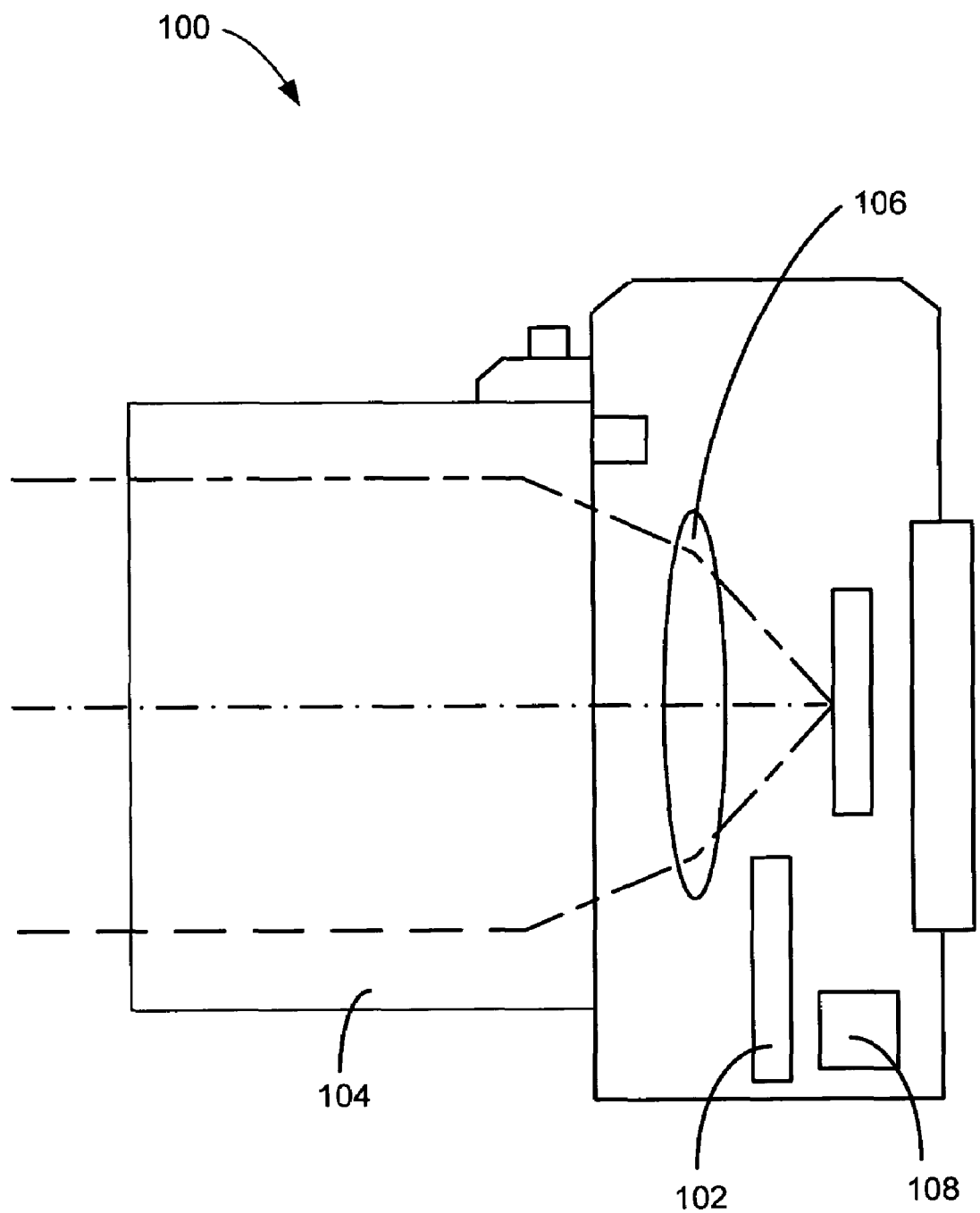
FIG. 1A is a block diagram view of a camera system including a harmonic frequency actuator system.

In the following description, numerous specific details are given to provide a thorough understanding of the invention. However, it will be apparent that the invention may be practiced without these specific details. In order to avoid obscuring the present invention, some well-known circuits, protection configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIG. Similarly, although the sectional views in the drawings for ease of description show the actuators as oriented vertically, this arrangement in the FIGs. is arbitrary and is not intended to suggest that the actuators should necessarily be fabricated in a vertical direction. Generally, the device can be operated in any orientation. The same numbers are used in all the drawing FIG. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top side" (as in "sidewall"), "higher", "lower", "upper", "over", and "under", are defined with respect to the horizontal plane.

Referring now to FIG. 1A, therein is shown a block diagram view of a camera system 100 including a harmonic frequency actuator system 102. The harmonic frequency actuator system 102 is mounted near a first lens system 104 and a second lens system 106. In this embodiment, movement provided by the harmonic frequency actuator system 102 is perpendicular to surfaces of the first lens system 104 and the second lens system 106. The harmonic frequency actuator system 102 interconnects mechanically to the first lens system 104 and the second lens system 106 to move each of the first lens system 104 and the second lens system 106 discretely. The movement perpendicular to the surfaces of the first lens system 104 and the second lens system 106 provides user feature controls, such as zoom and auto focus.

For illustrative purposes, the harmonic frequency actuator system 102 is shown in the camera system 100, although it is understood that the harmonic frequency actuator system 102 may be used in other systems, as well. Further it is understood that the harmonic frequency actuator system 102 may be placed in other locations, as well. Yet further, the harmonic frequency actuator system 102 may be used in any quantity, as well.

A control block 108 converts user feature controls into electrical levels designed and tuned to provide movement in the harmonic frequency actuator system 102. User feature controls, such as zoom, require user input conversion by the control block 108 into electrical levels to provide movement in the harmonic frequency actuator system 102. The zoom user feature is capable of changing the size of an optical image by changing gaps between lens groups (not shown). At least one of the lens groups is movable allowing user control over changing gaps between lens elements and providing varying sizes of the optical image.

An example of a zoom function includes a zoom lens characterized by a first lens group of positive optical power, a second lens group of negative optical power and a following lens component of positive optical power. During zooming, the first lens group moves so that the interval between the first lens group and the second lens group may become large at the telephoto end. Conversely, the first lens group moves so that the interval between the first lens group and the second lens group may become small at the wide angle end. At least one lens group included in the zoom lens system is moved for focusing resulting from a change in the object distance.

Other user feature controls, such as auto focus, require additional processing to determine electrical levels to provide movement in the harmonic frequency actuator system 102. The control block 108 converts the controls into electrical levels and may provide processing for auto focus using one or a combination of detection, such as contrast auto focus, phase difference auto focus and charge coupled device auto focus.

Auto focus typically requires the results of a comparison function. One such comparison function includes image data obtained and stored in memory. Two pieces of image data are compared and the phase difference computed. If the image is in focus, the two pieces of image data overlap one on the other, causing no phase difference. If the subject image is out of focus, there is a phase difference resulting in a deviation between the two pieces of image data. The magnitude of deviation is correlated to a magnitude of movement. The control block 108 provides electrical levels for the magnitude of movement in the harmonic frequency actuator system 102 to correct for the deviation.

Figure 1B:
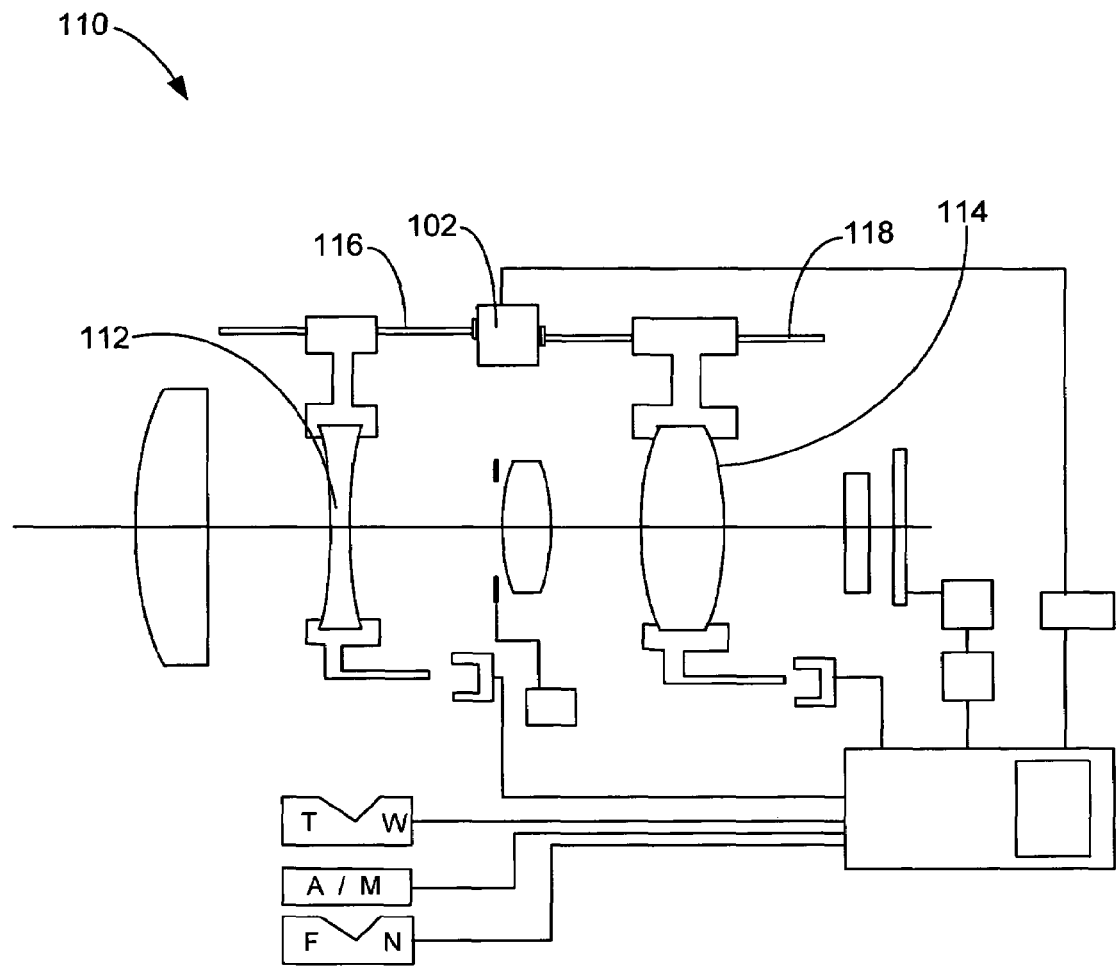
FIG. 1B is a block diagram view of a lens system including the harmonic frequency actuator system.

Referring now to FIG. 1B, therein is shown a block diagram view of a lens system 110 including the harmonic frequency actuator system 102. The harmonic frequency actuator system 102 is mounted near a zoom lens system 112 and a focus lens system 114. The harmonic frequency actuator system 102 interconnects mechanically to the first lens system 104 and the second lens system 106 to move each of the zoom lens system 112 and the focus lens system 114 discretely. For illustrative purposes, the harmonic frequency actuator system 102 is mounted between the zoom lens system 112 and the focus lens system 114, although it is understood that the harmonic frequency actuator system 102 may be mounted in other locations as well.

The harmonic frequency actuator system 102 provides movements to a zoom semi-rigid element 116 and a focus semi-rigid element 118 through "gripping, tossing and catching" with tight and sliding grips. The "gripping, tossing and catching" results in linear movement of the zoom semi-rigid element 116 and the focus semi-rigid element 118 perpendicular to the surfaces of the zoom lens system 112, the focus lens system 114 and the harmonic frequency actuator system 102. The linear movement both in the direction of the zoom lens system 112 and away from the zoom lens system 112 provides zoom, or focal length changes. Similarly, the linear movement both in the direction of the focus lens system 114 and away from the focus lens system 114 provides focus, or image clarity adjustment.

The zoom semi-rigid element 116 and the focus semi-rigid element 118 provide substantial longitudinal rigidity to move the zoom lens system 112 and the focus lens system 114, respectively. The surfaces of the zoom semi-rigid element 116 and the focus semi-rigid element 118 are also flexible in conforming to the harmonic frequency actuator system 102. When the harmonic frequency actuator system 102 is excited, it will pull away from the surface to provide the "gripping and tossing" effect. The surfaces of the zoom semi-rigid element 116 and the focus semi-rigid element 118 having a longer time constant would not resume their original shape prior to "catching". This provides the "gripping, tossing and catching" effect to move the zoom lens system 112 and the focus lens system 114 in both directions.

Figure 2:
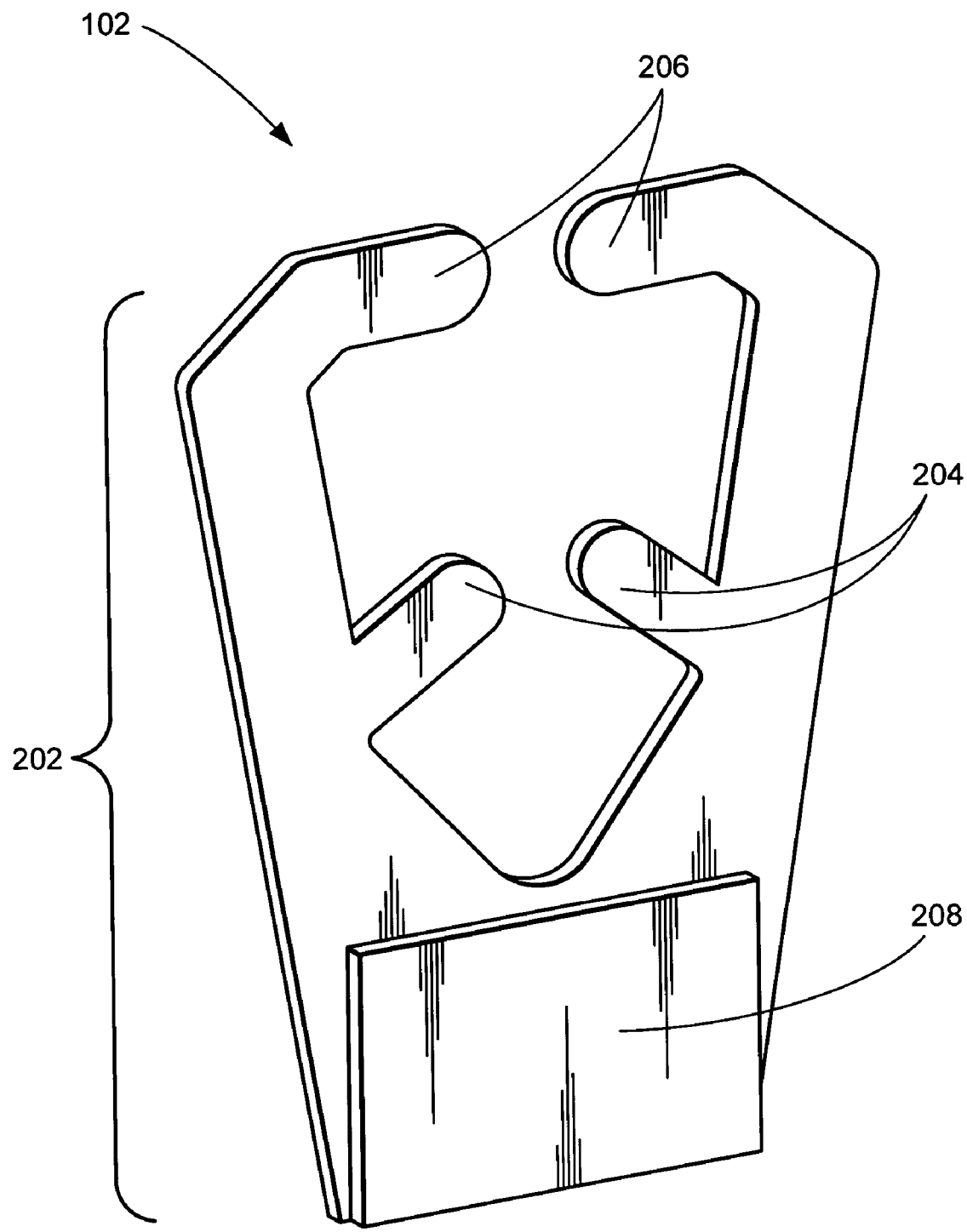
FIG. 2 is the harmonic frequency actuator system in an embodiment of the present invention.

Referring now to FIG. 2, therein is shown the harmonic frequency actuator system 102 in an embodiment of the present invention. The harmonic frequency actuator system 102 includes an actuator body 202 having a first set of fingers 204 and a second set of fingers 206, and a high frequency actuator 208. The actuator body 202 provides an attachment area (not shown) for the high frequency actuator 208. The geometry and end-constraints of the actuator body 202 are designed and tuned to frequency pairs that are offset between the first set of fingers 204 and the second set of fingers 206. The offset frequency pairs must be within a frequency domain provided by the high frequency actuator 208. The high frequency actuator 208 provides low power consumption and precise movement increments with excitation at predetermined electrical levels corresponding to the offset frequency pairs.

For illustrative purposes, the actuator body 202 is shown with two sets of fingers, although it is to be understood that there may be any number of sets of fingers, as well. Further, for illustrative purposes, the actuator body 202, the first set of fingers 204 and the second set of fingers 206 are shown as a single material, although it is understood that the actuator body 202, the first set of fingers 204 or the second set of fingers 206 may be made of multiple materials, as well. Yet further, for illustrative purposes, the actuator body 202, the first set of fingers 204 and the second set of fingers 206 are shown as a homogenous material, although it is understood that the actuator body 202, the first set of fingers 204 or the second set of fingers 206 may be made of compound materials, as well.

The high frequency actuator 208 is attached to the actuator body 202 and excites motion at a predetermined frequency. The predetermined frequencies are tuned to the unique geometries of the first set of fingers 204 and the second set of fingers 206. The unique geometries include symmetrically forming the first set of fingers 204 and the second set of fingers 206 to the fingers in the set, and the distance of the first set of fingers 204 and the second set of fingers 206 from the high frequency actuator 208. The excitation of the predetermined frequency provides an elliptical motion in the first set of fingers 204 and the second set of fingers 206. For illustrative purposes the high frequency actuator 208 is shown as a piezoelectronic ceramic actuator, although it is understood that other actuator materials or types may be used, as well.

The harmonic frequency actuator system 102 is activated by electrically charging the high frequency actuator 208 to a predetermined electrical level and cycling the high frequency actuator 208 quickly between charged and uncharged states. The predetermined electrical level corresponds to excitation of the high frequency actuator 208 to the predetermined harmonic frequency. One of a first harmonic frequency pair moves the first set of fingers 204. A first semi-rigid element (not shown) is placed between the first set of fingers 204. The movement of the first set of fingers 204 generates a motion for the first semi-rigid element, such as a flexure having a time constant significantly longer than the cycle time of the charged and uncharged states of the first set of fingers 204.

In a similar manner, one of a second harmonic frequency pair moves the second set of fingers 206. A second semi-rigid element (not shown) is placed between the second set of fingers 206. The movement of the second set of fingers 206 generates a motion for the second semi-rigid element, such as a flexure having a time constant significantly longer than the cycle time of the charged and uncharged states of the second set of fingers 206.

Figure 3:
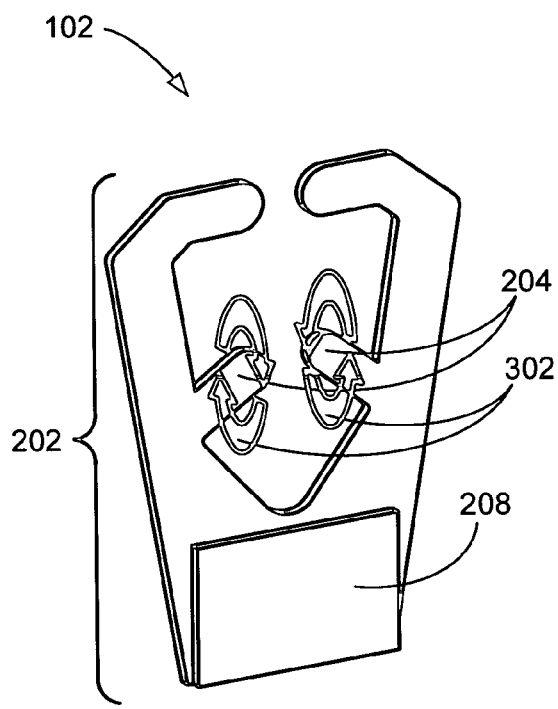
FIG. 3 is the harmonic frequency actuator system as shown in FIG. 2, with a first forward elliptical mode.

Referring now to FIG. 3, therein is shown the harmonic frequency actuator system 102 as shown in FIG. 2, with a first forward elliptical mode 302. The first forward elliptical mode 302 generates a downward motion for the first semi-rigid element placed between the first set of fingers 204. The "gripping, tossing and catching" of the first semi-rigid element is in small increments (less than 1 um) although the frequency may be high (several hundred kilohertz). The first set of fingers 204 are formed with the unique geometry designed and tuned to the first harmonic frequency pair. The frequency domain of the high frequency actuator 208 provides a range of frequencies for the first harmonic frequency pair. The high frequency actuator 208 is electrically charged to the predetermined electrical level and cycled quickly between charged and uncharged states, exciting the predetermined frequency and providing the motion in the first set of fingers 204.

For illustrative purposes the first forward elliptical mode 302 is shown as counter-clockwise with respect to the first semi-rigid element, although it is understood that other modes or motions may be used, as well. Further, it is understood that the direction of the motion of the first semi-rigid element may be different, as well. Yet further, for illustrative purposes, the first set of fingers 204 are shown in an angled orientation with respect to the actuator body 202, although it is understood that the first set of fingers 204 may be in other orientations such as a perpendicular orientation with respect to the actuator body 202, as well.

Figure 4:
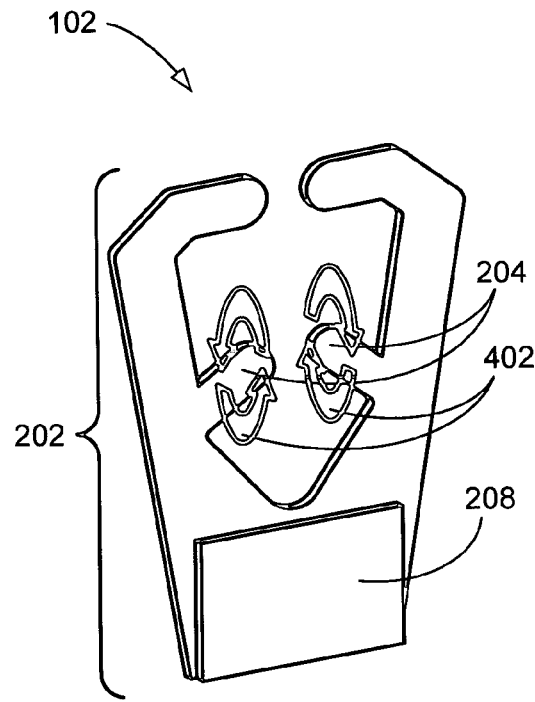
FIG. 4 is the harmonic frequency actuator system as shown in FIG. 2, with a first reverse elliptical mode.

Referring now to FIG. 4, therein is shown the harmonic frequency actuator system 102 as shown in FIG. 2, with a first reverse elliptical mode 402. The first reverse elliptical mode 402 generates an upward motion for the first semi-rigid element placed between the first set of fingers 204. The "gripping, tossing and catching" of the first semi-rigid element is in small increments (less than 1 um) although the frequency may be high (several hundred kilohertz). The first set of fingers 204 are formed with a unique geometry designed and tuned to the first harmonic frequency pair. The frequency domain of the high frequency actuator 208 provides a range of frequencies for the first harmonic frequency pair. The high frequency actuator 208 is electrically charged to the predetermined electrical level and cycled quickly between charged and uncharged states, exciting the predetermined frequency and providing the motion in the first set of fingers 204.

For illustrative purposes the first reverse elliptical mode 402 is shown as clockwise with respect to the first semi-rigid element, although it is understood that other modes or motions may be used, as well. Further, it is understood that the direction of the motion of the first semi-rigid element may be different, as well. Yet further, for illustrative purposes, the first set of fingers 204 are shown in an angled orientation with respect to the actuator body 202, although it is understood that the first set of fingers 204 may be in other orientations such as a perpendicular orientation with respect to the actuator body 202 as well.

Figure 5:
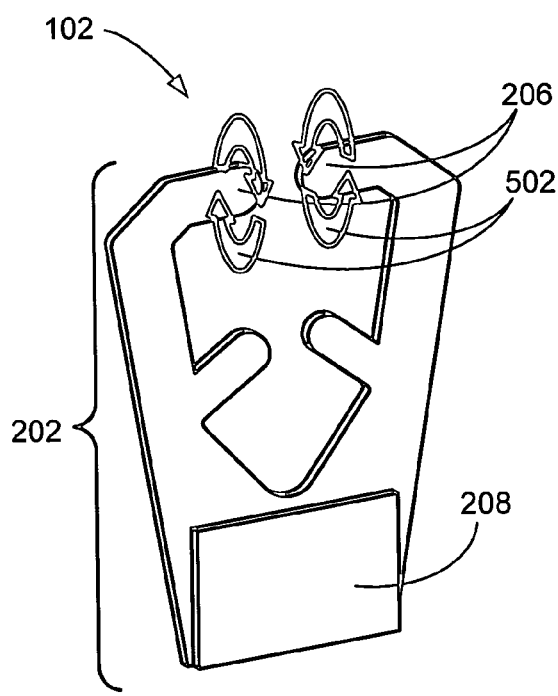
FIG. 5 is the harmonic frequency actuator system as shown in FIG. 2, with a second forward elliptical mode.

Referring now to FIG. 5, therein is shown the harmonic frequency actuator system 102 as shown in FIG. 2, with a second forward elliptical mode 502. In a manner similar to FIG. 3, the second forward elliptical mode 502 generates a downward motion for the second semi-rigid element placed between the second set of fingers 206. The "gripping, tossing and catching" of the second semi-rigid element is in small increments (less than 1 um) although the frequency may be high (several hundred kilohertz). The second set of fingers 206 are formed with the unique geometry designed and tuned to the second harmonic frequency pair. The frequency domain of the high frequency actuator 208 provides a range of frequencies for the second harmonic frequency pair. The high frequency actuator 208 is electrically charged to the predetermined electrical level and cycled quickly between charged and uncharged states, exciting the predetermined frequency and providing the motion in the second set of fingers 206.

For illustrative purposes the second forward elliptical mode 502 is shown as counter-clockwise with respect to the second semi-rigid element, although it is understood that other modes or motions may be used, as well. Further, it is understood that the direction of the motion of the second semi-rigid element may be different, as well. Yet further, for illustrative purposes, the second set of fingers 206 are shown in an perpendicular orientation with respect to the actuator body 202, although it is understood that the second set of fingers 206 may be in other orientations such as an angled orientation with respect to the actuator body 202, as well.

Figure 6:
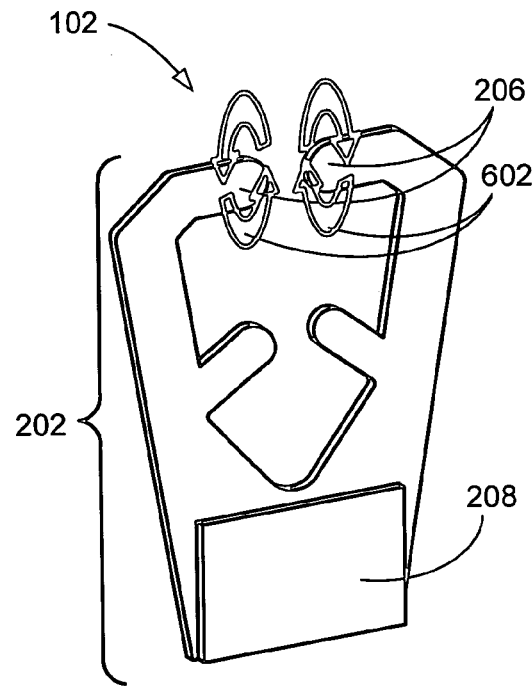
FIG. 6 is the harmonic frequency actuator system as shown in FIG. 2, with a second reverse elliptical mode.

Referring now to FIG. 6, therein is shown the harmonic frequency actuator system 102 as shown in FIG. 2, with a second reverse elliptical mode 602. In a manner similar to FIG. 4, the second reverse elliptical mode 602 generates an upward motion for the second semi-rigid element placed between the second set of fingers 206. The "gripping, tossing and catching" of the second semi-rigid element is in small increments (less than 1 um) although the frequency may be high (several hundred kilohertz). The second set of fingers 206 are formed with the unique geometry designed and tuned to the second harmonic frequency pair. The frequency domain of the high frequency actuator 208 provides a range of frequencies for the second harmonic frequency pair. The high frequency actuator 208 is electrically charged to the predetermined electrical level and cycled quickly between charged and uncharged states, exciting the predetermined frequency and providing the motion in the second set of fingers 206.

For illustrative purposes the second reverse elliptical mode 602 is shown as clockwise with respect to the second semi-rigid element, although it is understood that other modes or motions may be used, as well. Further, it is understood that the motion of the second semi-rigid element may be in a different direction, as well. Yet further, for illustrative purposes, the second set of fingers 206 are shown in an perpendicular orientation with respect to the actuator body 202, although it is understood that the second set of fingers 206 may be in other orientations such as an angled orientation with respect to the actuator body 202, as well.

Figure 7:
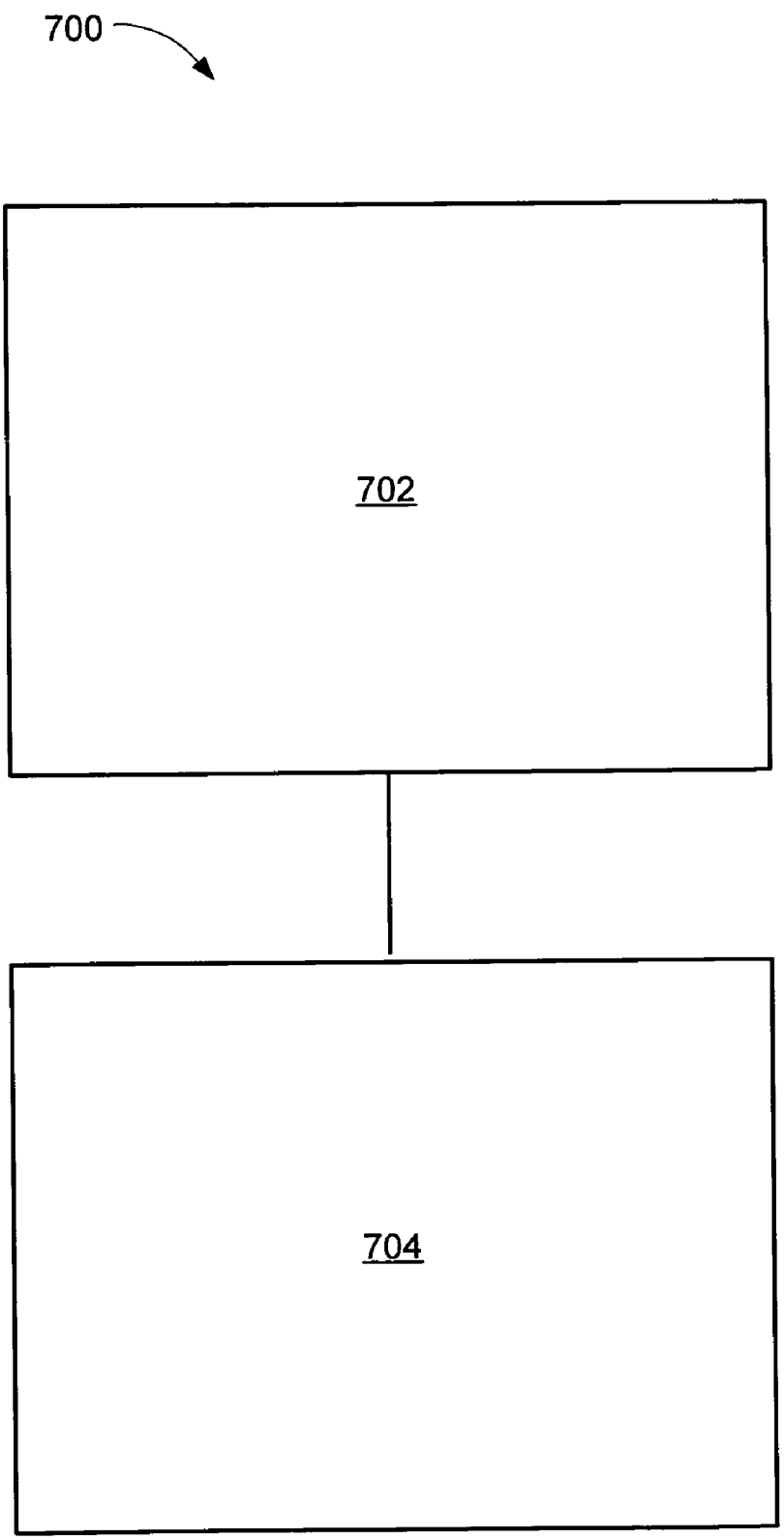
FIG. 7 is a flow chart of a system for a harmonic frequency actuator in an embodiment of the present invention.

Referring now to FIG. 7, therein is shown a flow chart of a system 700 for a harmonic frequency actuator in an embodiment of the present invention. The system 700 includes providing an actuator body, the actuator body having more than one set of fingers for generating motion for a semi-rigid element in a block 702; and attaching a high frequency actuator to the actuator body forming a harmonic frequency actuator to provide motion at predetermined frequency pairs in a block 704.

In greater detail, a method to fabricate the harmonic frequency actuator system 102, in an embodiment of the present invention, is performed as follows:

1. The actuator body 202 is formed having more than one set of fingers for generating a motion for a semi-rigid element. (FIG. 2)
2. The first set of fingers 204 and the second set of fingers 206 are formed with unique geometries tuned to offset predetermined frequency pairs within the frequency domain of the high frequency actuator 208. (FIG. 2)
3. The high frequency actuator 208 is attached to the actuator body 202 to provide motion at predetermined frequency pairs. (FIG. 2)

It has been discovered that the present invention thus has numerous aspects.

An aspect is that the present invention provides a single high frequency actuator, such as a piezoelectronic ceramic, driving two or more independent elements. This would allow considerable space savings for any application requiring small volume, low power movements over precise increments.

It has been discovered that the disclosed structure provides a reduction in the number of elements. Products and systems requiring multiple movements would reduce their electronic and mechanical complexity including points of failure. The overall solution would be lower cost and inherently more reliable.

It has also been discovered that the disclosed structure provides an infinite number of geometries that could be generated such that a single actuator could independently drive many gripping/tossing fingers. This concept is not limited to dual movements and could be extended to three, four, and more independent movements.

Yet another discovery of the disclosed structure is the adaptability to simple, low cost manufacturing processes. The actuator body with multiple sets of fingers can be easily produced in existing low cost, high volume manufacturing processes. The existing manufacturing processes provide improved product cost and product reliability.

These and other valuable aspects of the present invention consequently further the state of the technology to at least the next level.

Thus, it has been discovered that the harmonic frequency actuator system method and apparatus of the present invention furnish important and heretofore unknown and unavailable solutions, capabilities, and functional aspects for systems, such as cameras. The resulting processes and configurations are straightforward, cost-effective, uncomplicated, highly versatile and effective, can be implemented by adapting known technologies, and are thus readily suited for efficiently and economically manufacturing large die IC packaged devices.

The resulting processes and configurations are straightforward, cost-effective, uncomplicated, highly versatile and effective, can be implemented by adapting known technologies, and are thus readily suited for efficiently and economically manufacturing protection devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A system having a harmonic frequency actuator system comprising:

providing an actuator body, the actuator body having a first set of fingers with a different geometry than a second set of fingers, the first set of fingers and the second set of fingers for generating motions for first and second semi-rigid elements, wherein providing the actuator body comprises forming one of the first set of fingers or the second set of fingers with a predefined geometry tuned to a predetermined frequency different than that of the other of the second set of fingers or the first set of fingers, respectively; and attaching a high frequency actuator to the actuator body forming a harmonic frequency actuator to provide a range of frequencies for a first harmonic frequency pair of the first set of fingers and a second harmonic frequency pair of the second set of fingers; and mounting the harmonic frequency actuator to the system, wherein the harmonic frequency actuator provides motion to components in the system.

2. A system having a harmonic frequency actuator system comprising:

an actuator body, the actuator body having more than one set of fingers for generating a motion for a semi-rigid element, wherein the actuator body comprises a first set of fingers and a second set of fingers, one of the first set of fingers or the second set of fingers formed with a geometry tuned to a predetermined frequency different than that of the other of the second set of fingers or the first set of fingers, respectively; and a high frequency actuator attached to the actuator body forming a harmonic frequency actuator to provide motion at predetermined frequency pairs.

* * * * *